US008890232B2

United States Patent
Tsair et al.

(10) Patent No.: US 8,890,232 B2
(45) Date of Patent: Nov. 18, 2014

(54) METHODS AND APPARATUS FOR NON-VOLATILE MEMORY CELLS WITH INCREASED PROGRAMMING EFFICIENCY

(71) Applicant: Taiwan Semiconductor Manufacturing Company, Ltd., Hsin-Chu (TW)

(72) Inventors: Yong-Shiuan Tsair, Tainan (TW); Wen-Ting Chu, Kaohsiung (TW); Po-Wei Liu, Tainan (TW); Wen-Tuo Huang, Tainan (TW); Yu-Hsiang Yang, Tainan (TW); Chieh-Fei Chiu, Tainan (TW); Yu-Ling Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days.

(21) Appl. No.: 14/176,968

(22) Filed: Feb. 10, 2014

(65) Prior Publication Data
US 2014/0151782 A1 Jun. 5, 2014

Related U.S. Application Data

(63) Continuation of application No. 13/666,712, filed on Nov. 1, 2012, now Pat. No. 8,669,607.

(51) Int. Cl.
| *H01L 29/788* | (2006.01) |
| *H01L 27/115* | (2006.01) |
| *H01L 29/423* | (2006.01) |
| *H01L 21/28* | (2006.01) |

(52) U.S. Cl.
CPC ...... *H01L 21/28273* (2013.01); *H01L 29/7881* (2013.01); *H01L 27/11517* (2013.01); *H01L 29/42328* (2013.01)

USPC ............. 257/316; 257/E29.129; 257/E29.3; 438/257

(58) Field of Classification Search
CPC ............ H01L 29/788; H01L 29/42328; H01L 21/28273; H01L 27/11517
USPC ............. 257/316, E29.129, E29.3; 438/257
See application file for complete search history.

(56) References Cited

U.S. PATENT DOCUMENTS

| 6,747,310 B2 | 6/2004 | Fan et al. |
| 7,718,488 B2 | 5/2010 | Chen et al. |
| 7,868,375 B2 * | 1/2011 | Liu et al. ................... 257/320 |
| 2011/0006355 A1 * | 1/2011 | Shen et al. ................. 257/316 |

\* cited by examiner

*Primary Examiner* — Trung Q Dang
(74) *Attorney, Agent, or Firm* — Slater and Matsil, L.L.P.

(57) ABSTRACT

Methods and apparatus for non-volatile memory cells with increased programming efficiency. An apparatus is disclosed that includes a control gate formed over a portion of a floating gate formed over a semiconductor substrate. The control gate includes a source side sidewall spacer adjacent a source region in the semiconductor substrate and a drain side sidewall spacer, the floating gate having an upper surface portion adjacent the source region that is not covered by the control gate; an inter-poly dielectric over the source side sidewall spacer and the upper surface of the floating gate adjacent the source region; and an erase gate formed over the source region and overlying the inter-poly dielectric, and adjacent the source side sidewall of the control gate, the erase gate overlying at least a portion of the upper surface of the floating gate adjacent the source region. Methods for forming the apparatus are provided.

20 Claims, 14 Drawing Sheets

| Bias condition | Cell Operations | | | | | |
|---|---|---|---|---|---|---|
| | BL | WL | CG | EG | CS |
| Program | Vdp(~2.5uA) | 1~1.5 | 7~9 | 7~9 | 4~5 |
| Erase | 0 | 0 | 0 | 10~14 | 0 |
| Read | 0.3~1.8 | 1.8~3.3 | 1.8~3.3 | 1.8~3.3 | 0 |

Fig. 14

METHODS AND APPARATUS FOR NON-VOLATILE MEMORY CELLS WITH INCREASED PROGRAMMING EFFICIENCY

This application is a continuation of, and claims priority to, U.S. patent application Ser. No. 13/666,712, entitled "Methods and Apparatus for Non-Volatile Memory Cells with Increased Programming Efficiency," filed on Nov. 1, 2012, which application is incorporated herein by reference.

BACKGROUND

Continuing reduction of the minimum features produced by semiconductor processes and reduction in the size of the resulting devices has enabled continued improvements in speed, performance, density, and cost per unit function of integrated circuits and systems. As semiconductor process nodes continue to shrink, the various structures also become smaller. Certain features then experience reduced coupling, which has negative performance impact on the non-volatile cells. For example, the erase gate to floating gate coupling is a function of the area of the two structures which are formed separated by one or more dielectric layers. As the cell sizes shrink, the structures shrink and the erase gate to control gate coupling is reduced, which reduces performance.

In a typical "split gate" arrangement for FLASH cells, the erase gate is formed over a common source region between memory two cells each having control gates over floating gate electrodes that are surrounded by dielectric material. The coupling area of the floating gate and the erase gate that is available for coupling during a cell programming cycle is important to the cell performance. As the area for coupling is reduced, the programming cycle performance degrades. This is reflected either in the need for increased potentials on the control gate or in reduced programming speed.

As reliable memory becomes increasingly important for portable devices, such as mobile phones, tablet computers and other battery operated devices, the use of non-volatile memory is increasingly prevalent. Thus, the need for efficiently manufactured, robust and cost effective FLASH memory cells with high performance is increasing.

BRIEF DESCRIPTION OF THE DRAWINGS

For a more complete understanding of the illustrative embodiments, and the advantages thereof, reference is now made to the following descriptions taken in conjunction with the accompanying drawings, in which:

FIG. 14 illustrates in a table various operations of an embodiment non-volatile memory cell.

Corresponding numerals and symbols in the different figures generally refer to corresponding parts unless otherwise indicated. The figures are drawn to clearly illustrate the relevant aspects of the illustrative embodiments and are not necessarily drawn to scale.

DETAILED DESCRIPTION OF ILLUSTRATIVE EMBODIMENTS

The making and using of the example illustrative embodiments are discussed in detail below. It should be appreciated, however, that an illustrative embodiment provides many applicable inventive concepts that can be embodied in a wide variety of specific contexts. The specific embodiments discussed are merely illustrative of specific ways to make and use the embodiments, and these examples do not limit the scope of this description and do not limit the scope of the appended claims.

The embodiments herein are presented for discussion and illustration, but do not limit the scope of the disclosure and do not limit the scope of the appended claims. Embodiments of this disclosure include methods for forming a non-volatile memory cell with a floating gate, a dielectric disposed over the floating gate, and a control gate disposed over the dielectric. The floating gate has a portion that extends towards a common source region in the substrate and that is not covered by the control gate. An erase gate is formed over the common source region that has a portion overlying the top surface of a portion of the floating gate, which is isolated from the floating gate by an inter-poly dielectric. The electrical coupling between the floating gate and the erase gate is increased by use of the embodiments, thereby increasing performance of the non-volatile memory cells, particularly in programming operations.

Figure 1:
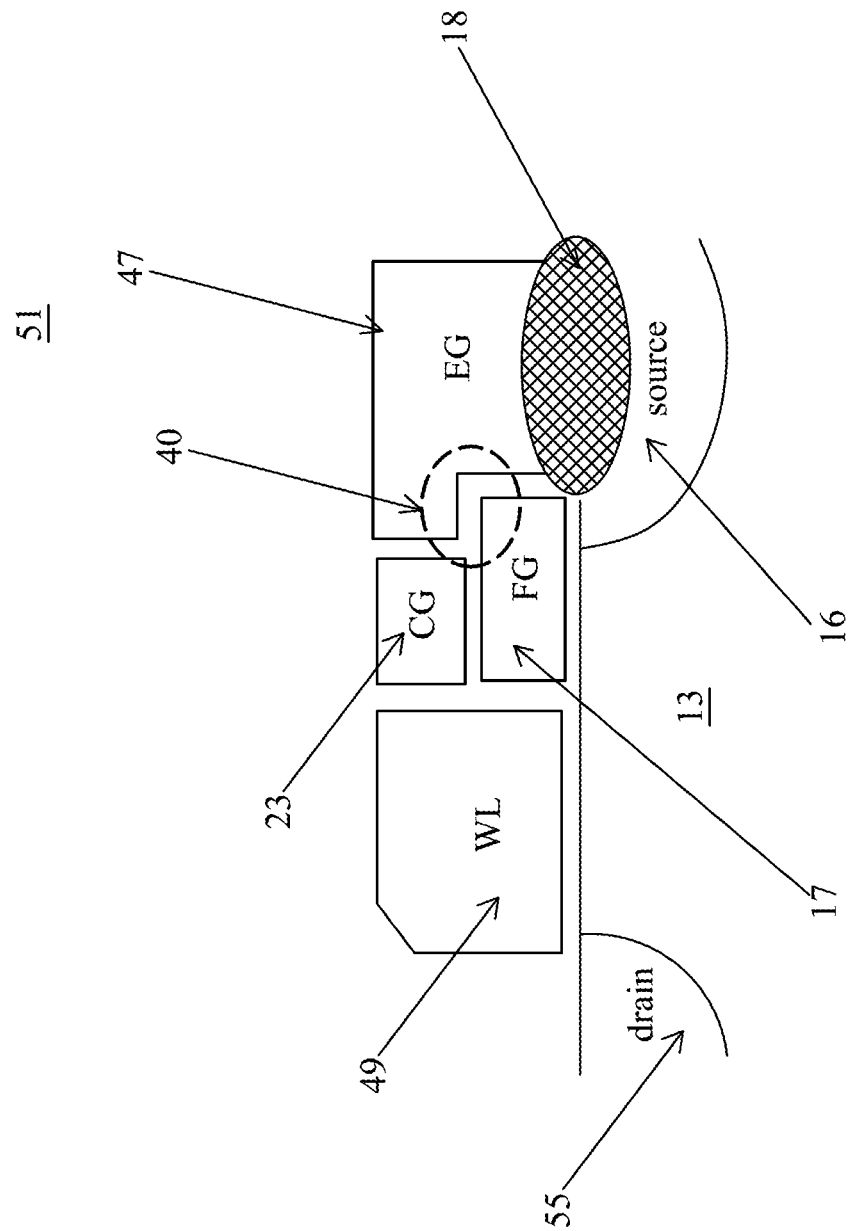
FIG. 1 depicts, in a cross sectional view, an embodiment non-volatile cell.

FIG. 1 depicts, in a cross-sectional view, a simplified illustration of an example embodiment non-volatile memory cell 51. In FIG. 1, a semiconductor substrate 13 has a drain region 55 formed in the substrate and a source region 16 spaced from it. Source and drain regions 55 and 16 may be formed by implanting dopant ions and diffusion to form doped diffusion regions, for example. A word line 49 (sometimes referred to as a "select gate") is formed over, and insulated from, the substrate 13, and a floating gate 17 is also formed over, and insulated from, substrate 13 by a dielectric layer. (For simplicity, the dielectric layers are not shown in detail in FIG. 1).

The word line 49 and floating gate region 17 form a "split gate" in that, to cause current to flow between the source and drain regions, a sufficient potential must be present on both the word line 49 and the floating gate 17. The potential on the floating gate 17 is caused by the control gate 23. During an operation, the potentials applied to the word line 49 and the control gate 23 may cause a potential on the floating gate 17 to form a channel region in the substrate 13 between the drain 55 and the source 16, allowing current to flow. Erase gate 47 is formed over the source region 16 and insulated from the substrate by another dielectric 18, which may be an oxide, for example. Erase gate 47 also overlies a portion of the floating gate 17. In embodiments, this overlap may be from 5% to about 20% of the surface area of the floating gate 17. In certain cell operations, a potential is placed on the erase gate 47 and coupling is used to couple the erase gate to the floating gate 17; the overlap of the erase gate 47 over floating gate 17 in the embodiments provides increased erase gate to floating gate coupling, when compared to prior cells, and increases programming speed, for example. In read operations, the potential on the erase gate may also be increased (as compared to conventional structures and operations) to increase performance by taking advantage of the increased coupling between the floating gate 17 and the overlying erase gate 47.

The floating gate 17 may store charge that is placed on the floating gate by a programming operation. As is known, the charge storing phenomenon allows a programmable threshold device with a floating gate to form a non-volatile memory cell. When the non-volatile cell is storing charge, a device read threshold is increased so when a read potential is placed on the control gate and the word line, no channel forms, and a nominal voltage placed at the drain terminal, for example, 1.2 Volts, is not changed. When the cell is erased, and no charge is stored on the floating gate 17, a lower turn on threshold is formed, so that when a read potential is placed on the control gate 23 and the word line 49, and a ground or zero potential is at the source 16, a nominal voltage at the drain will be pulled down to ground by a channel region formed in the substrate 13 and coupling the drain 55 to the source 16. By assigning a logical value of "0," for example, to the erased cell and a "1" to the programmed cell, data may be stored using the floating gate.

In a typical non-volatile memory device, many cells such as 51 are arranged in rows and columns. The drain terminals are, in an example embodiment, coupled to bit lines and arranged in columns. The source regions 16 may also be arranged in columns and may be shared between two columns of cells to form a "common source" for the cells. The word lines 49 and the control gates 23 may be coupled to decoded row lines, for example. Address decoders are used to select blocks of cells for reading data words onto the bit lines, and sense amplifiers may be used to sense the bit line voltages. By placing a pre-charge or nominal voltage on a group of bit lines during a read cycle, and selecting row of non-volatile cells coupled to the bit lines, a word from a particular row in an array may be read onto the bit lines and sensed by sense amplifiers. In this way, the data stored in the non-volatile memory array may be read. Write operations are programming operations where the data to be stored is placed on a bit line, and potentials are applied to the word line, control gate, and erase gates to program the selected memory cells to store the data. Erasure of the cells may be accomplished using the erase gates to remove charge from the floating gates, a higher potential on the erase gate can remove the charge and place the non-volatile cells in an unprogrammed or erased state.

Figure 2:
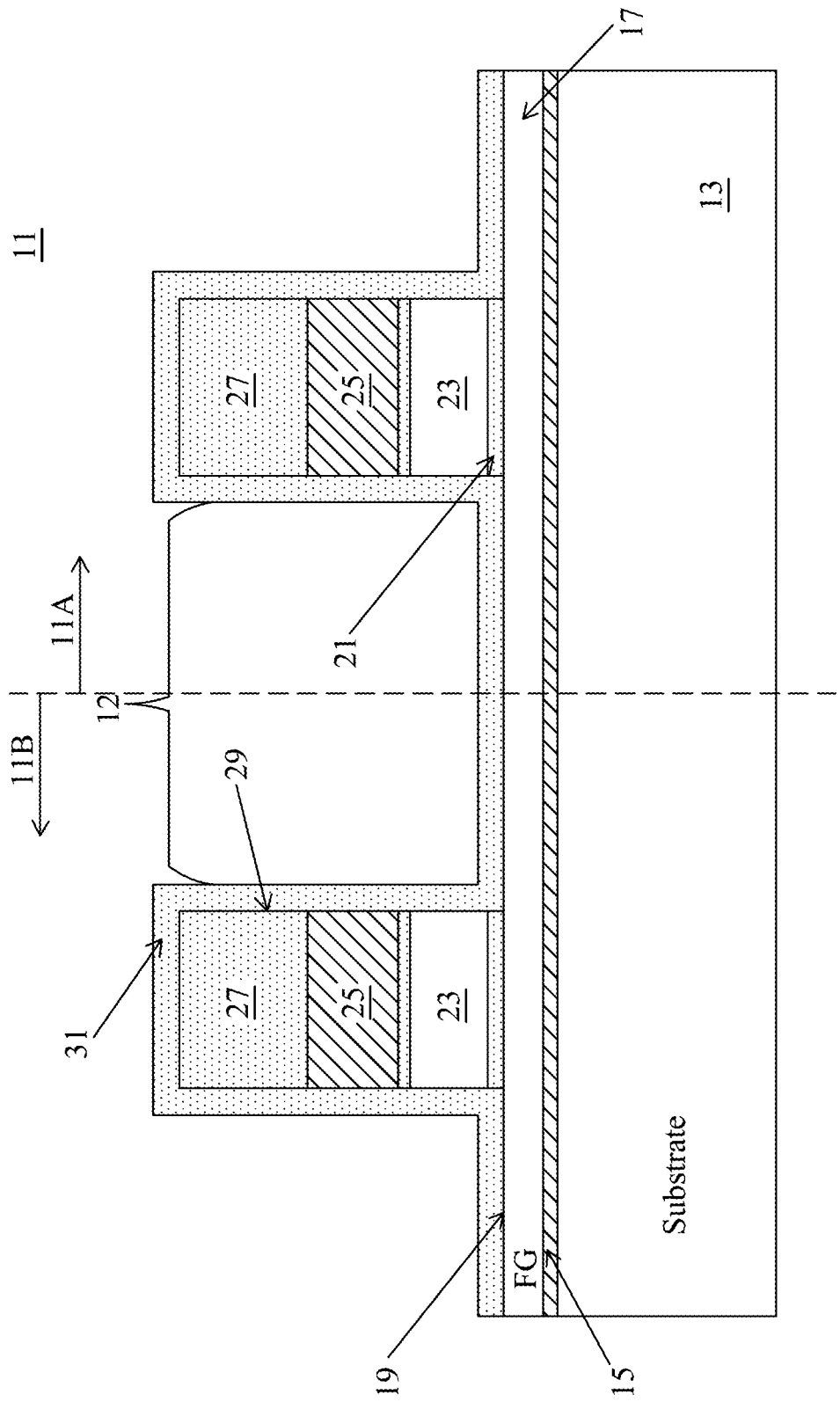
FIG. 2 depicts a cross-sectional view of a non-volatile memory cell structure at an intermediate process step to illustrate the use of the embodiments.

FIG. 2 depicts, in a cross-sectional view, a first intermediate process stage for forming a pair of non-volatile memory cells 11A and 11B in a structure 11, using an example method embodiment. Note that while the illustrated embodiments are described in terms of a method that forms pairs of non-volatile memory cells spaced apart by a common source region, these are only examples. The embodiments may be formed without the use of the common source region and without forming paired cells; instead a non-volatile cell structure embodiment may be formed with a dedicated source region. For example, a single cell 51 is shown in FIG. 1.

In FIG. 2, semiconductor substrate 13 is provided. The semiconductor substrate in one embodiment is a silicon wafer. In alternative embodiments, a gallium arsenide substrate may be used. Other alternative embodiments include germanium and indium. While a semiconductor substrate 13 is depicted in FIG. 2, in another alternative embodiment, an SOI layer could be used instead of a semiconductor wafer for the substrate 13.

In FIG. 2, a floating gate layer 17 is shown lying over a dielectric layer 15. The floating gate layer 17, in one embodiment, is a polysilicon layer. A thin dielectric layer 19 is also shown overlying the floating gate layer 17. In an example embodiment, the thin dielectric layers 15 and 19 are formed of an oxide, such as a thermal oxide or a native oxide layer, alternatively a deposited oxide may be used. Each non-volatile cell 11A and 11B is symmetric and formed on opposing sides of a common source region 12 of semiconductor substrate 13. Each non-volatile cell 11A and 11B includes a dielectric layer 21 between the floating gate layer 17 and a control gate 23. The control gate 23 is, in one embodiment, polysilicon. The drain regions are not shown in these figures but for each of the non-volatile cells 11A and 11B, the drain side is the side of the cell opposite the source side, which is adjacent the common source region 12.

As is known to those skilled in the art, the dielectric layer 21 may be a charge trapping dielectric layer such as an oxide-nitride (ON) or in an alternative embodiment, an oxide-nitride-oxide (ONO) layer. The non-volatile cells 11A and 11B each also have an oxide 25 over the control gate 23 and a silicon nitride (SiN) layer 27 over the oxide layer 25. Layer 27 may be removed later in the process, as described below. The control gates 23, the oxide layer 25 and the silicon nitride layer 27 are patterned to form vertical control gate electrode stacks for each of the non-volatile cells 11A and 11B. The control gate electrode stacks are further covered with another thin oxide layer 29 and in the intermediate process step of FIG. 2, with a nitride layer 31. In other embodiments, alternative dielectric materials may be used for the layers 29 and 31.

Figure 3:
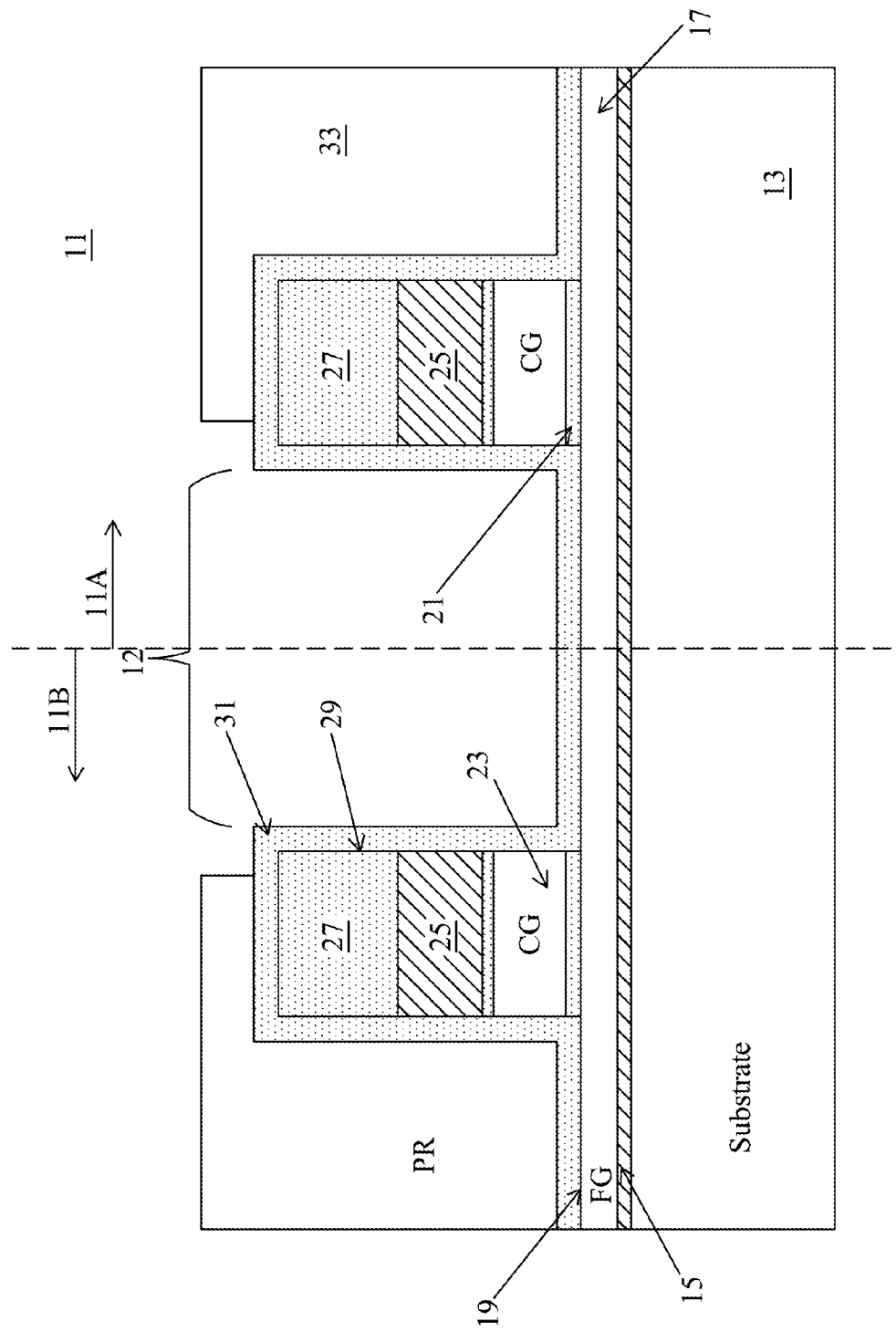
FIG. 3 depicts, in a cross-sectional view, the structure of FIG. 2 following forming a photoresist for additional processing.

FIG. 3 depicts the non-volatile cell structure 11 of FIG. 2 in cross section following additional processing steps. In FIG. 3, each of the cells 11A and 11B has photoresist layer 33 formed over structure 11. Photoresist layer 33 is patterned by photolithography and etch to form a mask that covers, for each of the cells 11A and 11B, a drain side portion, while exposing the common source region 12 between the two cells 11A and 11B. The remaining elements of FIG. 3 are the same as in FIG. 2, the reference numerals are the same and no further explanation is needed. This photolithographic step is added to the processes to enable processing to be performed on the common source region 12 and on the source side sidewalls of non-volatile cells 11A and 11B, while the drain side sidewalls of non-volatile cells 11A and 11B away from the common source region 12 remain covered and are not affected by the processing.

Figure 4:
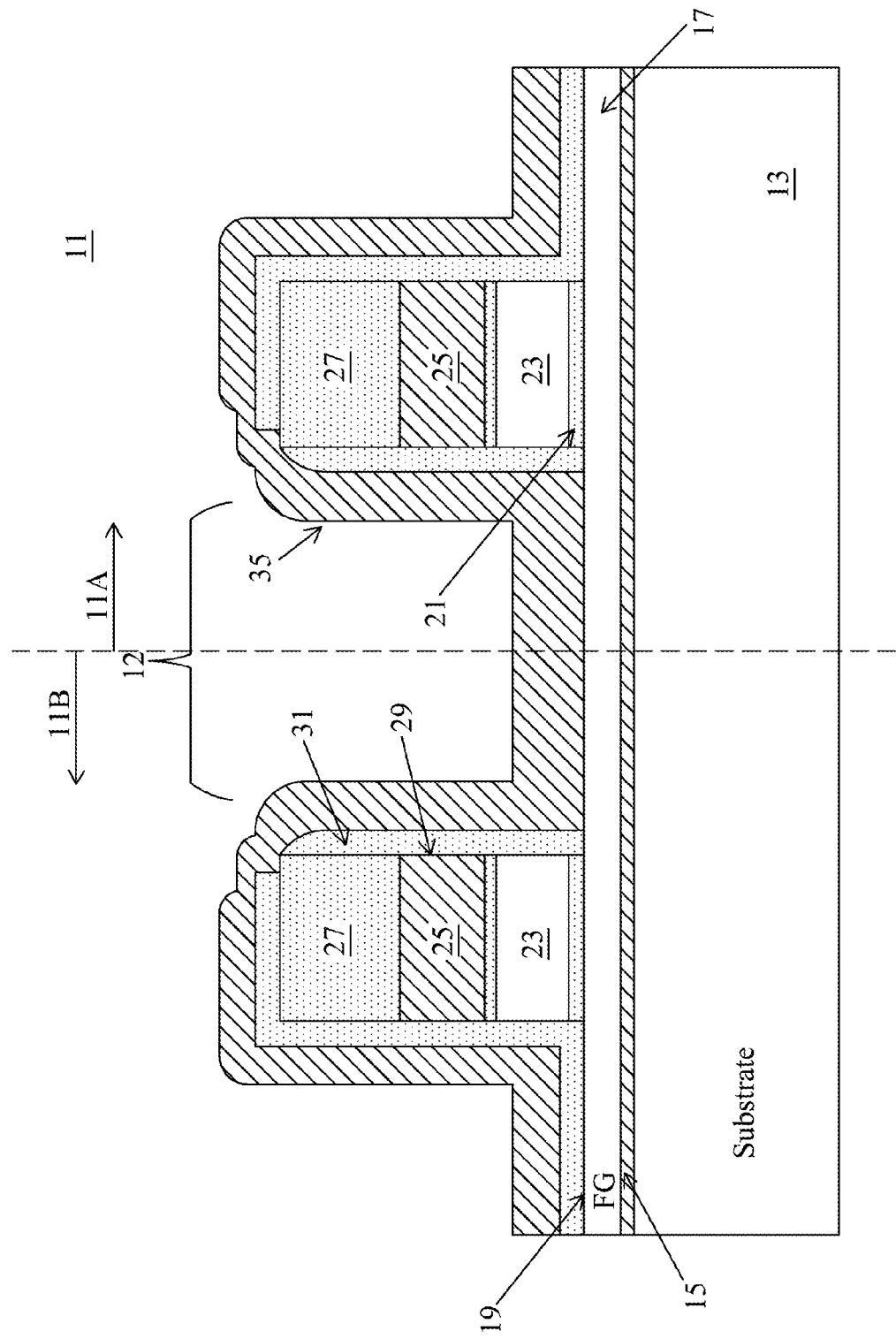
FIG. 4 depicts, in a cross-sectional view, the structure of FIG. 3 following additional processing including depositing an oxide layer.

FIG. 4 depicts the non-volatile memory structure 11 of FIG. 3 in a cross section following additional processing. To transition from the cross section of FIG. 3 to the cross section of FIG. 4, an etch process is performed to remove the silicon nitride 31 from the surface of the substrate 13 in the common source region 12 between cells 11A and 11B. The source side sidewalls of layer 31 for each of the memory cells 11A and 11B are also shaped by the etch process. After the etch process, which may be for example a dry etch, the photoresist mask 33 is removed. This may be done by a PR strip process, for example. A thick oxide deposition is then performed to form oxide layer 35 over the source side sidewalls of each of the non-volatile cells 11A and 11B, over the surface of the substrate 13, and over the top and drain side sidewalls of the non-volatile cells 11A and 11B. The oxide 35 is thicker in some areas than in others as shown. This variation in thickness occurs because in the common source region 12, the oxide is formed over another oxide layer (the silicon nitride 31 over the substrate was removed by the prior etch step), while for the source side sidewalls of the non-volatile cells 11A and 11B, the oxide thickness 35 is greater due to the deposition loading effects with the sidewalls of the two non-volatile cells being in close proximity across the common source region 12. The thick oxide layer 35 is formed, for example, by a CVD oxide deposition.

Figure 5:
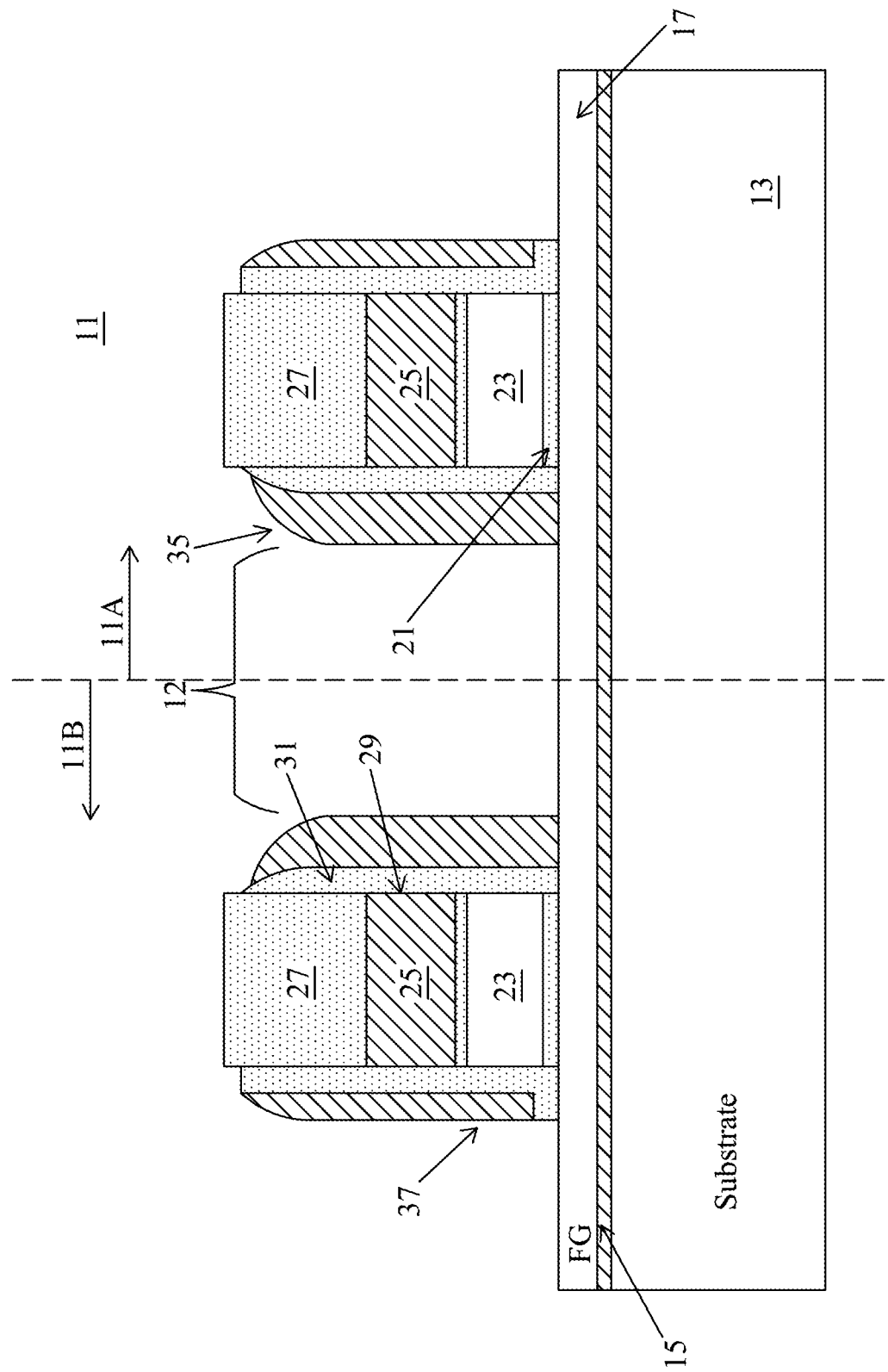
FIG. 5 depicts, in a cross-sectional view, the structure of FIG. 4 following additional processing including an etch process to shape the sidewalls.

FIG. 5 depicts the structure 11 in cross section following additional process steps. To transition from the cross section of FIG. 4 to the stage shown in FIG. 5, additional etch processing is done to remove the thicker oxide layer 35 from the surface of the substrate 13 in the common source region 12, and outside of the cell area, and from the top surfaces of the non-volatile cells 11A and 11B. In an embodiment, the oxide etch may be anisotropic, for example. The thicker oxide 35 remains on the source side sidewalls of the non-volatile cells 11A and 11B on the control gate stacks, and a thinner portion 37 remains on the drain side sidewalls of the control gate stacks. Thus, at this stage, the sidewalls for the non-volatile cells 11A and 11B are asymmetric, thicker on the source side sidewalls, and thinner on the drain side sidewalls.

Figure 6:
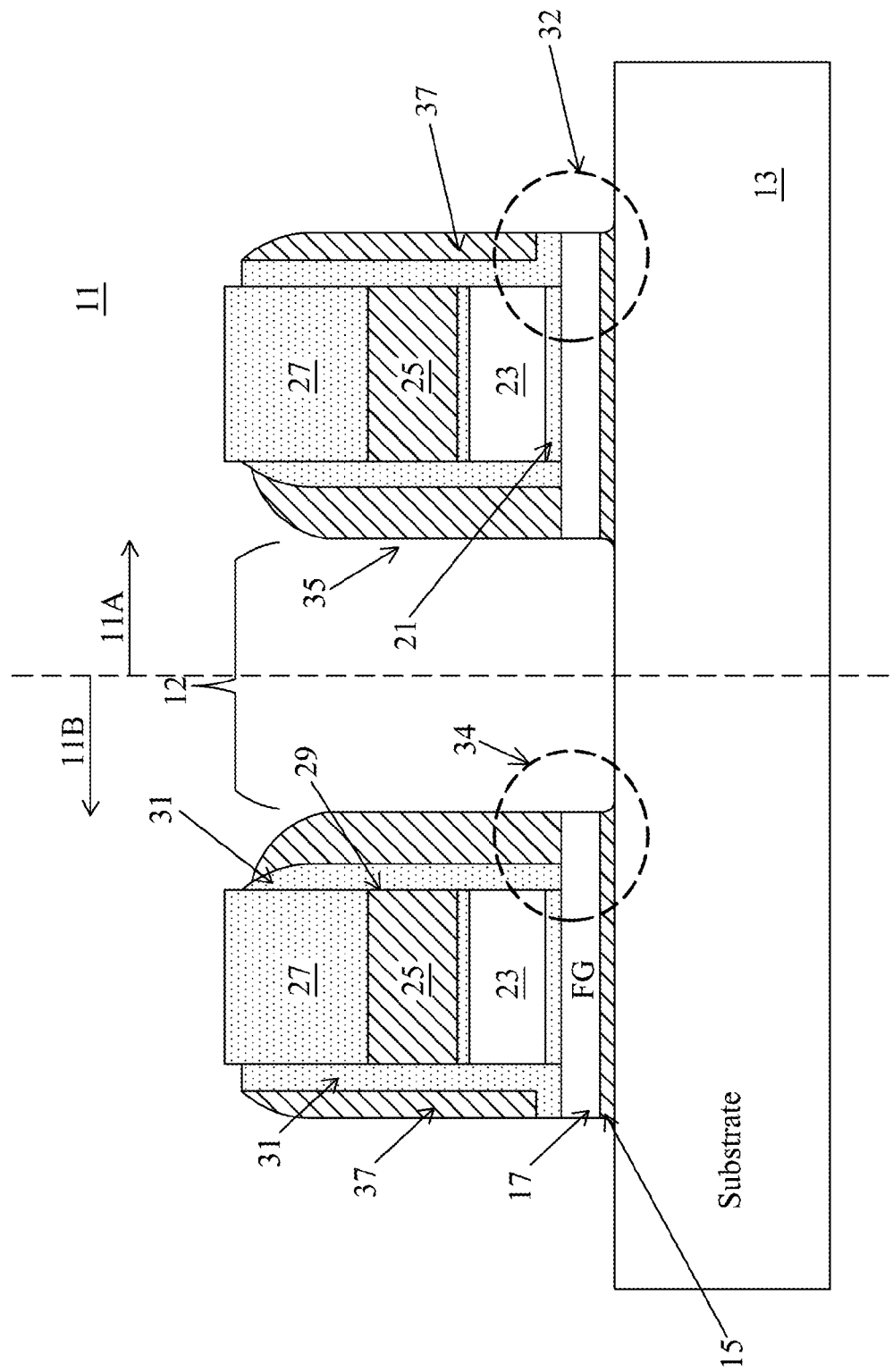
FIG. 6 depicts, in a cross sectional view, the structure of FIG. 5 following additional processing including etching the floating gate layer.

FIG. 6 depicts, in cross section, the structure 11 of FIG. 5 following additional process steps. To transition from the cross section of FIG. 5 to that shown in FIG. 6, the floating gate layer 17 was etched, or cut, using the source side and drain side sidewalls of the non-volatile cells 11A and 11B as masks to self align the floating gate 17 to the control gate stack sidewalls. Area 34 depicts the source side sidewall of floating gate 17 for non-volatile cell 11B, which extends past the control gate towards the common source region 12; area 32 depicts the drain side sidewall of the floating gate 17 for non-volatile cell 11A, which does not extend as far from the control gate edge. Thus, the use of the asymmetric sidewalls to define the etch pattern for the floating gate layer 17 has formed asymmetric floating gates for each of the cells 11A and 11B. The use of the asymmetric sidewalls provides a structure with increased capacitive coupling between an erase gate and the floating gate, as described below.

Figure 7:
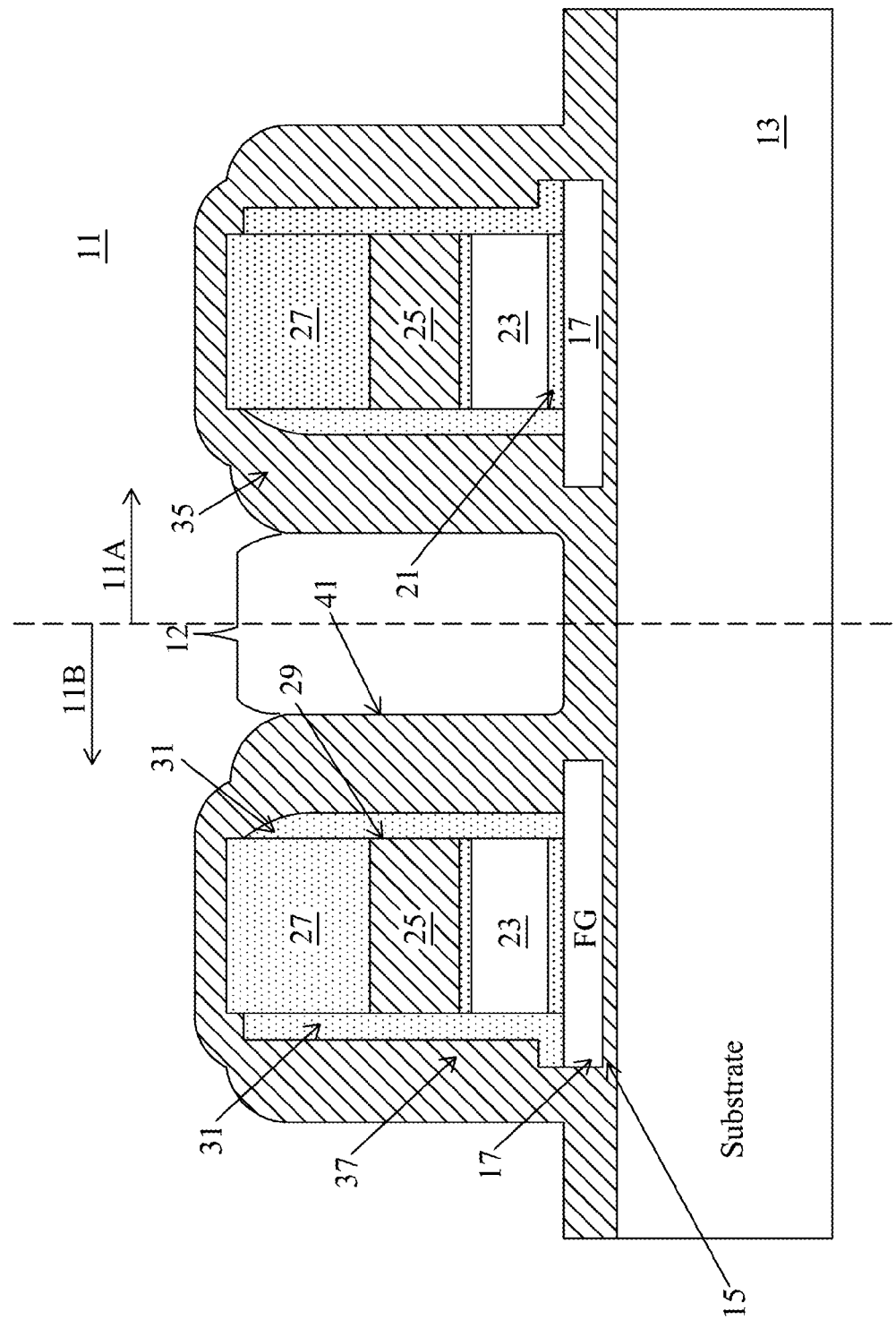
FIG. 7 depicts, in a cross sectional view, the structure of FIG. 6 following additional processing including another oxide deposition.

FIG. 7 depicts the structure 11 from FIG. 6, in cross section, following still another processing step. In FIG. 6, a thick oxide layer 41 is deposited over the entire structure. This oxide 41 is, in one embodiment, a high temperature oxide (HTO), which may be formed by use of rapid thermal CVD (RTCVD) processing at a temperature of greater than 500 degrees Celsius, for example. In alternative embodiments, the temperature for the RTCVD process may vary between around 500 to around 900 degrees Celsius, and in one example embodiment is around 700-800 degrees C. (HTO layer 41 covers the sidewalls of non-volatile cells 11A and 11B on the source side, the semiconductor substrate 13 over the common source region 12 and the top and drain side sidewalls of the non-volatile cells 11A and 11B.

Figure 8:
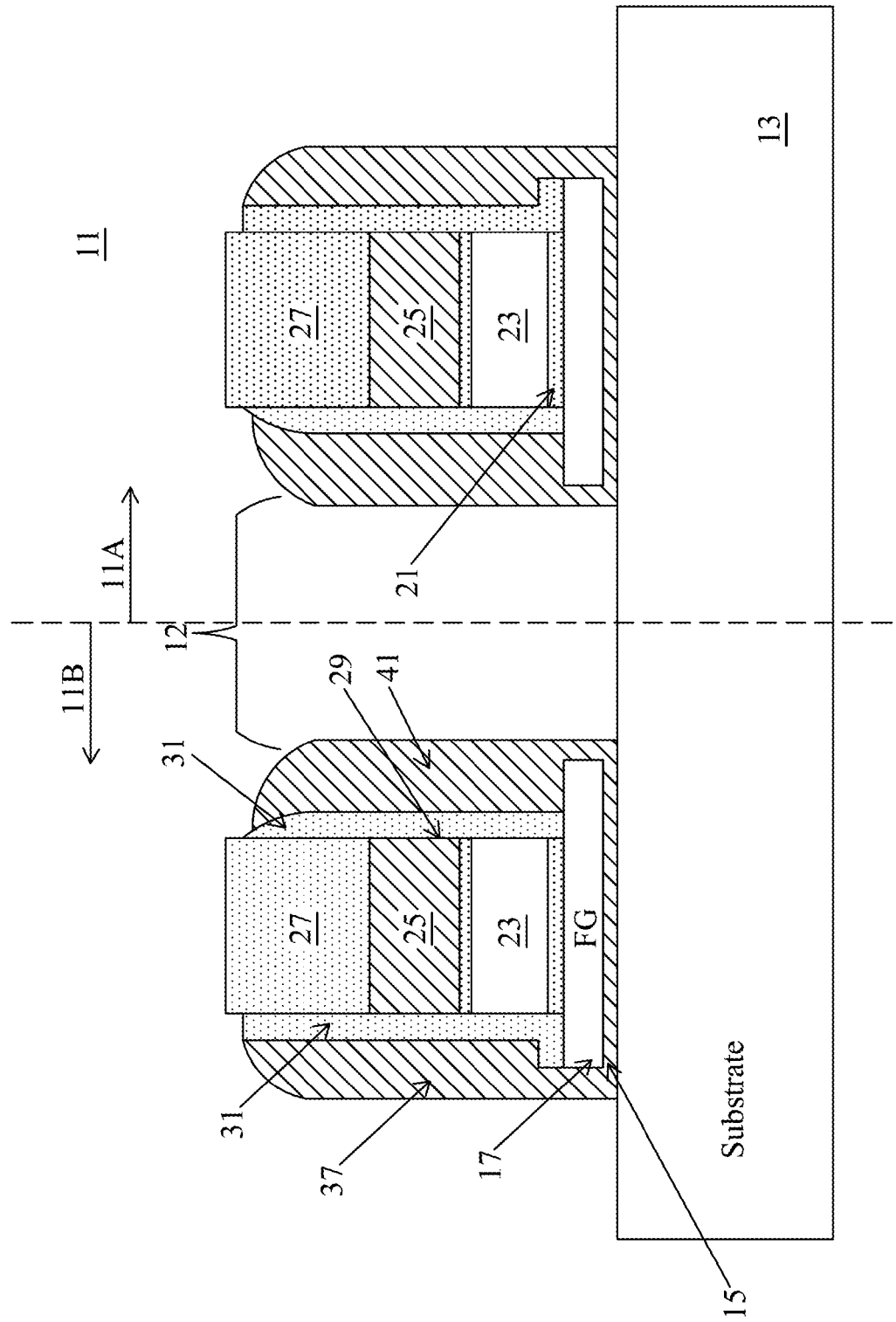
FIG. 8 depicts, in a cross-sectional view, the structure of FIG. 7 following additional processing including an etch process on the oxide of FIG. 7.

FIG. 8 depicts, in another cross sectional view, the structure 11 of FIG. 7 following an etch process. In FIG. 8, the oxide layer 41 is etched to remove the oxide layer from the horizontal surfaces such as the surface of substrate 13 in common source region 12, and from the top surface of the silicon nitride 27 over the non-volatile cells 11A and 11B. The etch also shapes the sidewalls of the non-volatile cells 11A and 11B and thins the oxide layer 41 as shown.

Figure 9:
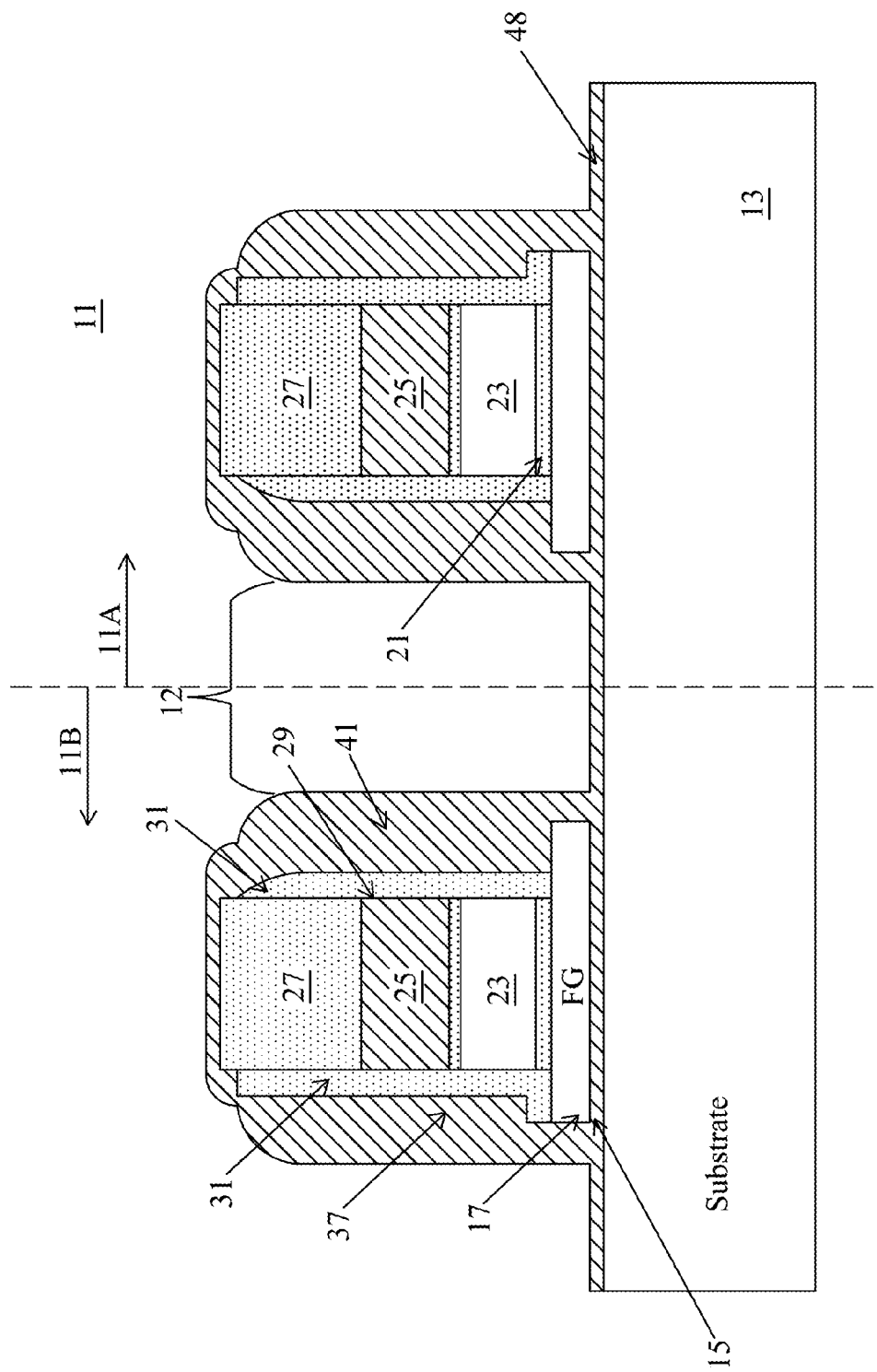
FIG. 9 depicts, in a cross-sectional view, the structure of FIG. 8 following an additional oxide deposition.

FIG. 9 depicts, in another cross sectional view, the structure 11 of FIG. 8 following additional processing. In FIG. 9, an oxide layer 48 is deposited over the thick oxide layer 41, on the sidewalls of the non-volatile cells 11A and 11B, and over the surface of the semiconductor substrate 13.

Figure 10:
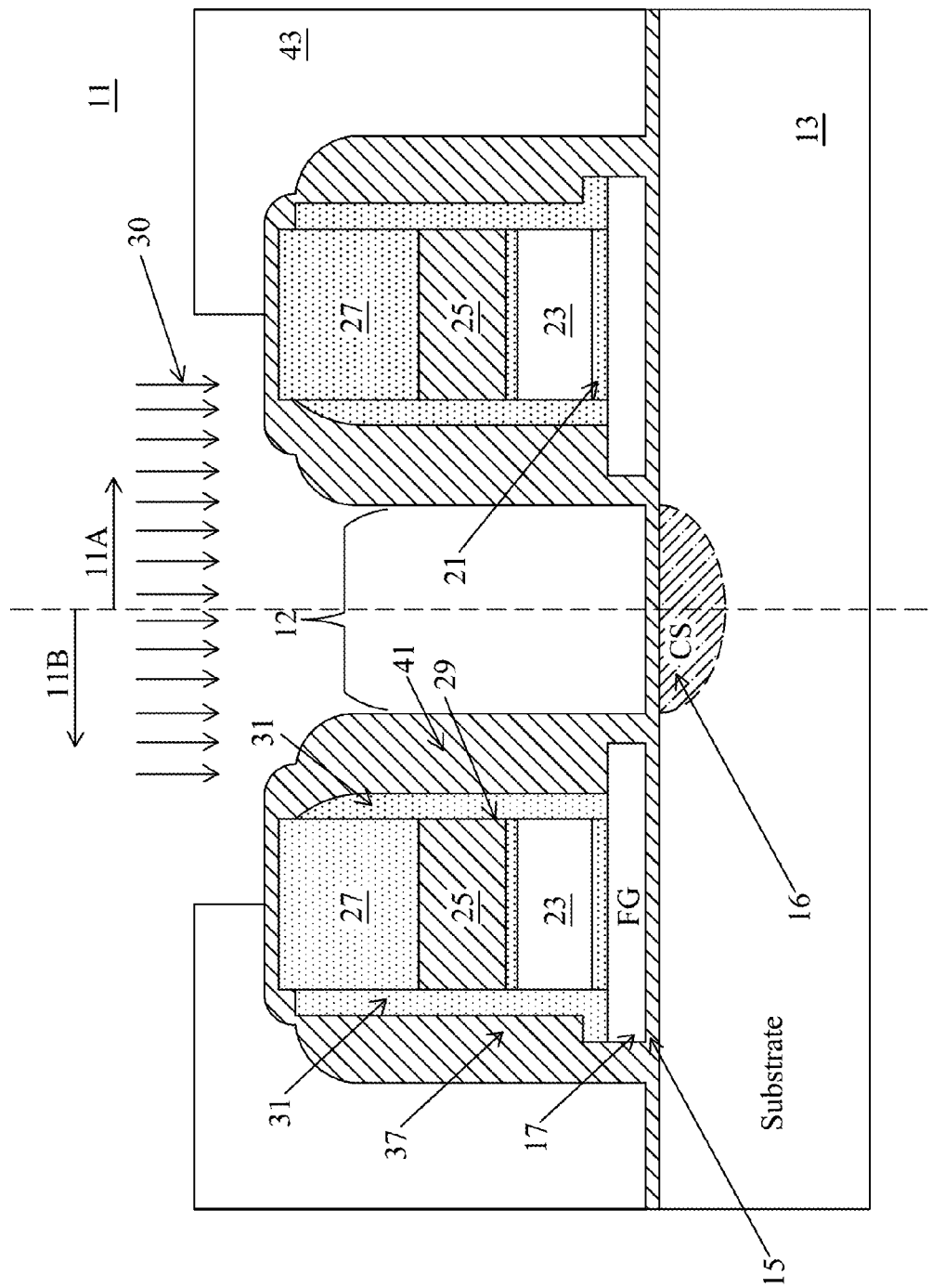
FIG. 10 depicts, in a cross-sectional view, the structure of FIG. 9 following forming a photoresist structure for an ion implantation step.

FIG. 10 depicts, in another cross sectional view, the structure 11 of FIG. 9 during an ion implant to form a common source 16 in the common source region 12. This implant may, in one embodiment, correspond to an ion implantation performed for the high voltage ion implant (HVII) used for high voltage devices formed elsewhere on the substrate, so the same process step is used to implant the common source 16 as for the HVII implants used elsewhere to form high voltage transistors, for example, on substrate 13. In an alternative embodiment, the implant of ions 30, as shown in FIG. 10, is not used for other devices. Prior to the ion implant 30, shown in FIG. 10, another photoresist layer 43 is formed and using photolithography and etch, is patterned to expose the common source region 12, and the source side sidewalls with layers 41 and 48 on them, while covering the drain side sidewalls of the non-volatile cells 11A and 11B. In this manner, the common source 16 is aligned to the oxide 41 on the sidewalls, on the source side, of the non-volatile cells 11A and 11B.

Figure 11:
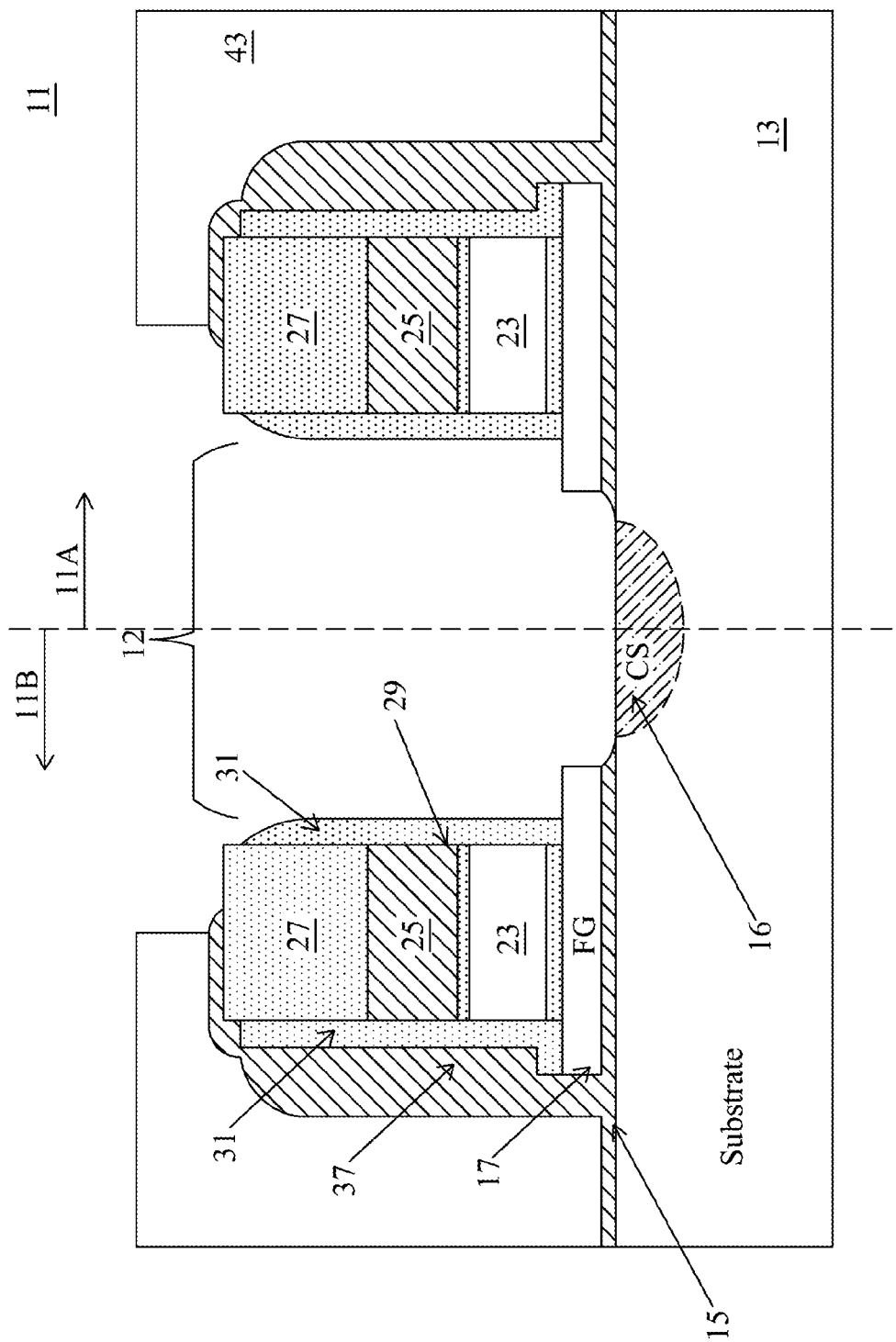
FIG. 11 depicts, in a cross-sectional view, the structure of FIG. 10 following additional processing steps to form a common source region.

FIG. 11 depicts, in another cross sectional view, the structure 11 following additional process steps. In FIG. 11, the oxide layer 48 and the oxide layer 41 are removed from the source side sidewalls of the non-volatile cells 11A and 11B, and from the common source region 12, by a wet etch sometimes referred to as an HTO "dip" process. The source side sidewalls of each of the cells 11A and 11B are now free from oxide and are covered by silicon nitride layer 37, and the common source 16, a doped diffusion region, is also free from oxide. Photomask 43 remains and protects the drain side sidewalls and portions of substrate 13 during the HTO wet etch process.

Figure 12:
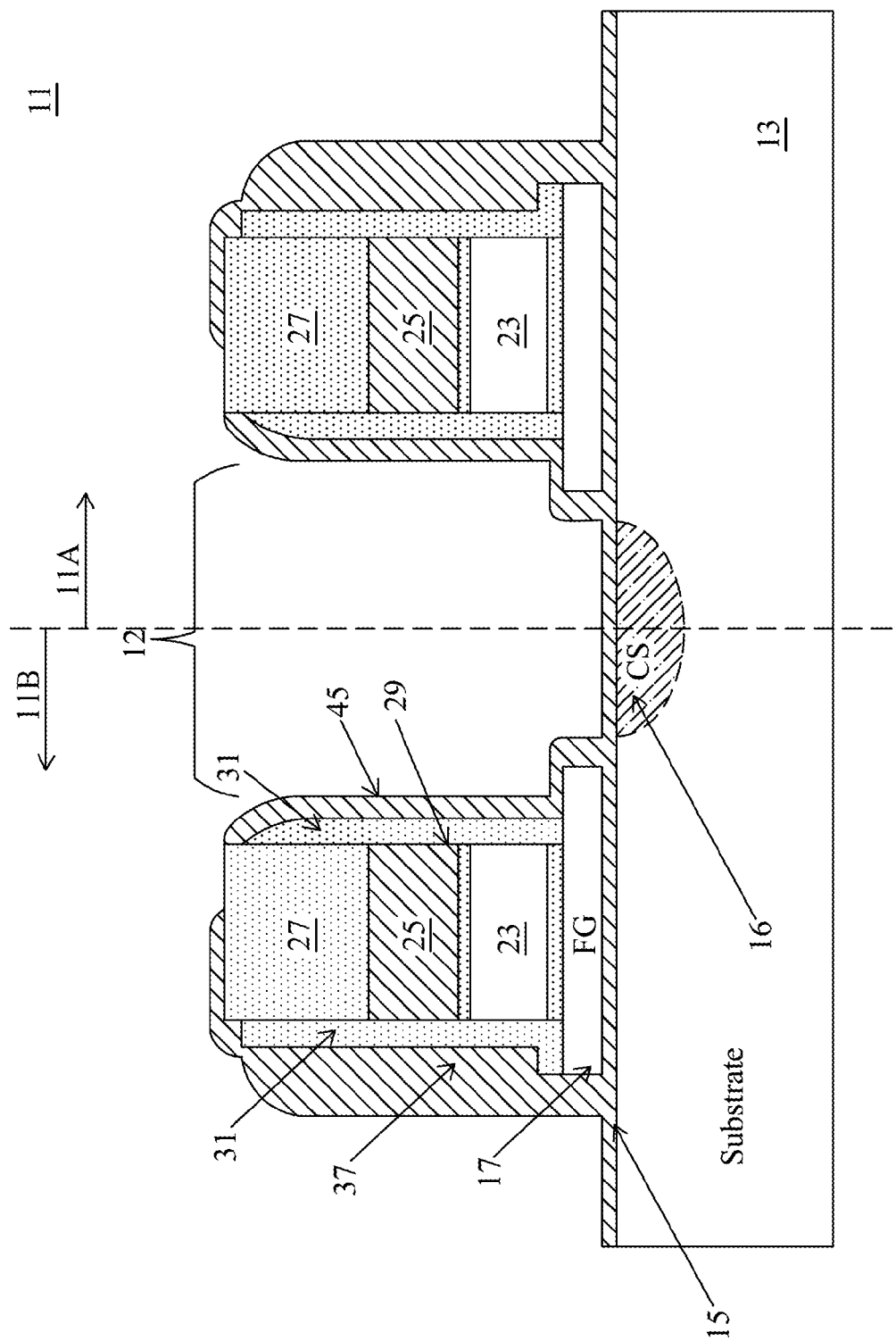
FIG. 12 depicts, in a cross-sectional view, the structure of FIG. 11 following additional processing steps including deposition of an inter-poly dielectric.

FIG. 12 depicts the structure 11 of FIG. 11, in a cross sectional view, following additional processing steps. An inter-poly dielectric 45, which may be formed by another oxide deposition, is deposited over the structure and forms a layer over the source side sidewalls of the non-volatile cells 11A and 11B, over the floating gates 19 for each of the cells, and over the substrate 13. This inter-poly dielectric may be from 90-140 Angstroms in thickness, in an example embodiment. In alternative embodiments, other dielectric materials may be used for the inter-poly dielectric 45.

Figure 13:
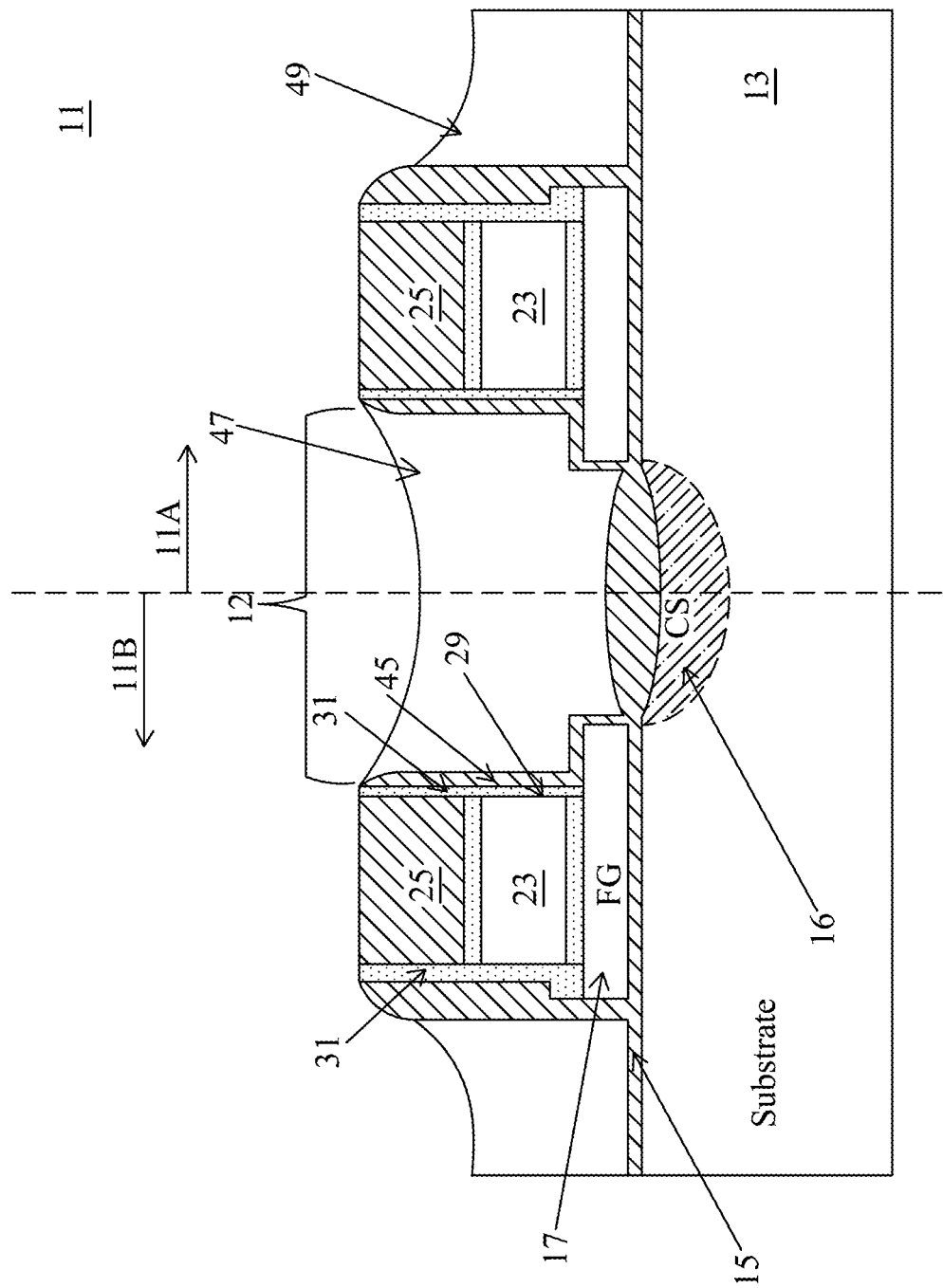
FIG. 13 depicts, in a cross-sectional view, the structure of FIG. 12 following deposition of polysilicon structures to complete an embodiment non-volatile cell.

FIG. 13 depicts, in another cross sectional view, the structure 11 following additional processing steps. To transition from the stage shown in FIG. 11 to that of FIG. 12, several process steps were performed. A polysilicon deposition was performed to deposit erase gate 47 in common source region 12, and adjacent the drain side sidewalls of each of the non-volatile cells 11A and 11B, a select gate 49 which may be coupled to form word lines for the non-volatile cells. Following the polysilicon deposition to form the erase gate 47 and select gates 49, an etch was performed that shaped the poly-silicon erase and select gates 47 and 49, and silicon nitride layer 27 (not shown in FIG. 13) was also removed from the top portion of each of the non-volatile cells 11A and 11B. As shown in FIG. 13, the erase gate polysilicon 47 is insulated from the floating gate 17 from the erase gate 47 by the inter-poly dielectric 45. The erase gate 47 has a portion that overlies each of the floating gates 17 on the source side of non-volatile cells 11A and 11B, that is a portion of the horizontal surface of the floating gates 17 for each cell that are not covered by the control gate are instead below a portion of the erase gate 47, increasing the area available for coupling between the erase gate 45 and the floating gate 17 for each of the non-volatile cells 11A and 11B. In an embodiment, as shown in FIG. 1 for example, the erase gate 47 overlies at least 5% of the upper surface of floating gate 17 for each of the cells 11A and 11B. In another embodiment, the erase gate 47 overlies an upper surface of floating gate 17 by between 5% and 20%. In another embodiment, the erase gate 47 overlies the upper surface of the floating gate 17 by between 5% and 10%. The structure of the embodiments provides increased coupling between the erase gate 47 and the floating gates 17 due to the fact the erase gate 47 now overlies a portion of each of the floating gates 17.

FIG. 14 presents, in table form, the potentials applied to various portions of a non-volatile cell using the embodiments to illustrate the operations. In a programming operation, as shown in the first row of the table, a data voltage Vdp is placed on a bit line (BL) that is coupled to the drain region of a non-volatile cell, such as shown in FIG. 1. A potential of between 1-1.5 Volts is placed on the word line (WL). A higher potential of between 7-9 Volts is placed on both the control gate and the erase gate (CG and EG) of the cell. The common source (CS) is placed at a potential of between 4-5 Volts. As is known in the art, a channel hot electron programming operation will pull electrons onto the floating gate depending on the programming data voltage Vdp. In contrast to the prior approach cells, the control gate using the embodiments may use a lowered potential during programming. Alternatively, the potential on the control gate may be raised to the prior approach levels of 10-14 Volts, and the programming cycle may be shortened in time (faster programming speed) due to the coupling of the erase gate to the floating gate achieved by use of the embodiments.

In FIG. 14, in the second row, the table also illustrates the potentials for an erase operation. During a cell erase operation, a potential of between 10-14 Volts, for example, is placed on the erase gate (EG) and the remaining portions of the cell are placed at a 0 potential, so that charge on the floating gate is drawn to the erase gate, and the cell is erased and available for future programming.

In FIG. 14, the bottom row illustrates the potentials used during a read operation. During a read, a nominal potential is placed on a bit line (BL) coupled to the drain region of the cell. In an example embodiment, the BL potential is between about 0.3-1.8 Volts during a read. A read potential of between 1.8-3.3 Volts is placed on the word line (WL) and the control gate (CG). Depending on whether the cell is programmed (higher turn on potential) or unprogrammed (lower turn on potential), the cell may then turn on and couple the bit line to the common source (CS), which is at a zero potential. In contrast to operations using the prior cells, in the embodiments with the erase gate overlying a portion of the floating gate, a read potential may also be placed on the erase gate and increase the coupling to the floating gate; increasing performance. As shown in FIG. 14, the read potential on the erase gate may also be between 1.8-3.3 Volts. Note that the potentials in FIG. 14 are provided as examples, and are somewhat dependent on the process used, so that in other embodiments, other potentials may be used. Generally, as semiconductor processes advance, the potentials used will be reduced. However, the advantages obtained by use of the embodiments will still increase performance, irrespective of the actual potentials used in a device, and the illustrative embodiments provided are not limiting. The embodiments provide an erase gate that overlies a portion of the floating gate for non-volatile memory cells, increasing the capacitive coupling from the erase gate to the floating gate. In contrast to the prior approaches, where for programming operations the potential on the control gate dominates the programming speed, programming speed may be increased in the embodiment cells by using potentials at both the erase gate and the control gate. Alternatively, lower control gate potentials may be used during programming of the cells of the embodiments, while maintaining the programming speed at prior speeds. The use of lower potentials on the control gate during programming may reduce power consumed without any performance loss.

During read cycles, the erase gate in embodiment cells may also receive a read potential and due to the increased coupling of the erase gate to the floating gate, increase performance of the cells.

In one embodiment, a method includes forming a floating gate layer over a semiconductor substrate, forming a control gate layer over the floating gate layer, and patterning the control gate layer to form a control gate having a source side sidewall adjacent a common source region in the semiconductor substrate, and a drain side sidewall adjacent a drain region in the semiconductor substrate; depositing an oxide over the control gate and the floating gate layer; removing the oxide from the horizontal portions of the floating gate layer and patterning the oxide over the control gate, the oxide forming asymmetric sidewall spacers on the control gate, a source side sidewall spacer being thicker than a drain side sidewall spacer; using the source side sidewall and drain side sidewall spacers as a mask, etching the floating gate layer to form a floating gate; removing the oxide from the source side sidewall of the control gate and from a portion of the floating gate adjacent the common source region, so that a portion of the floating gate adjacent the common source region has an exposed upper surface; depositing an inter-poly dielectric layer over the source side sidewall of the control gate and over the exposed upper surface of the floating gate; and forming an erase gate over the common source region in the substrate and overlying the inter-poly dielectric layer, the erase gate being adjacent to the source side sidewall of the control gate and overlying at least a portion of the upper surface of the floating gate.

In another embodiment, the above method includes wherein the erase gate overlies at least 5 percent of the upper surface of the floating gate. In an alternative embodiment, in the above method, the erase gate overlies between 5 and 20 percent of the upper surface of the floating gate. In yet another embodiment, in the above method, the erase gate overlies between 5 and 10 percent of the upper surface of the floating gate.

In yet another embodiment, the above methods include performing an ion implant in the common source region to form a doped source in the semiconductor substrate.

In still a further embodiment, in the above methods, the ion implant includes depositing a high temperature oxide over the control gate and the floating gate, and patterning the high temperature oxide to form an alignment mask for the ion implant.

In still another alternative embodiment, the above methods include forming a dielectric region over the floating gate and underlying the control gate. In a further embodiment, in the above methods, forming the erase gate, control gate, and floating gate comprise forming polysilicon. In yet another embodiment, in the above methods, the inter-poly dielectric has a thickness of between 90-120 Angstroms. In still another embodiment, in the above methods, forming the oxide layer comprises performing a CVD oxide deposition.

In another method embodiment, a method includes forming a floating gate layer over a semiconductor substrate; forming a pair of control gate electrodes over the floating gate layer spaced apart by a common source region, each of the control gate electrodes having a source side sidewall adjacent the common source region and each of the control gate electrode having an opposing drain side sidewall; depositing an oxide layer over the pair of control gate electrodes and the floating gate layer; etching the oxide layer from the horizontal portions of the floating gate layer including the common source region, and forming oxide sidewall spacers on the source side sidewall and the drain side sidewall of each of the control gates, the oxide sidewall spacers on the source side sidewalls being thicker than the oxide sidewall spacers on the drain side sidewalls; using the oxide sidewall spacers as a mask, etching the floating gate layer to form a floating gate for each of the pair of control gates, the control gates and the floating gates forming a pair of non-volatile cells spaced apart by the common source region; removing the oxide from the source side sidewalls and from the floating gates adjacent the common source region, exposing an upper surface of a portion of each of the floating gates adjacent the common source region; depositing an inter-poly dielectric layer over the source side sidewalls of the control gates and over the exposed upper surface portion of each of the floating gates; and forming an erase gate over the common source region, the erase gate being adjacent to the source side sidewalls of the control gates and overlying a portion of the upper surface portion of the floating gates for each of the pair of non-volatile cells.

In another alternative embodiment, in the above method, the erase gate over the common source region overlies at least 5 percent of the upper surface portion of the floating gates for the pair of non-volatile cells. In still another embodiment, in the above methods, the erase gate over the common source region overlies between 5 and 20 percent of the upper surface portion of the floating gates for the pair of non-volatile cells. In yet another method embodiment, the methods further include performing an ion implant step to form a diffused source in the common source region of the semiconductor substrate. In still another embodiment, in the above methods, forming the erase gate, the control gate, and the floating gate layer comprise depositing polysilicon.

In another embodiment, an apparatus comprises a semiconductor substrate having a source region formed in the semiconductor substrate and having a drain region formed in the semiconductor substrate, spaced from the source region; a floating gate region formed over the semiconductor substrate and disposed between the source region and the drain region, the floating gate having a source side sidewall and an upper surface; a control gate formed over a portion of the floating gate, the control gate having a source side sidewall adjacent the source region in the semiconductor substrate and a drain side sidewall adjacent the drain region, a portion of the upper surface of the floating gate adjacent the source region not covered by the control gate, the source side sidewall having a source side sidewall spacer of a first thickness and the drain side sidewall of the control gate having a drain side sidewall spacer of a second thickness greater than the first thickness, the source side sidewall spacer and the drain side sidewall spacer being asymmetric with respect to one another; an inter-poly dielectric over the source side sidewalls and the upper surface of the floating gate adjacent the source region; and an erase gate formed over the source region and overlying the inter-poly dielectric, and adjacent the source side sidewall of the control gate, the erase gate overlying at least a portion of the upper surface of the floating gate adjacent the source region. In a further alternative embodiment, in the above apparatus, the erase gate overlying at least a portion of the upper surface of the floating gate covers at least 5 percent of the upper surface of the floating gate. In another embodiment, in the above apparatus, the erase gate overlying at least a portion of the upper surface of the floating gate covers between 5 and 20 percent of the upper surface of the floating gate. In still another embodiment, in the above apparatus, the erase gate overlying at least a portion of the upper surface of the floating gate covers between 5 and 10 percent of the upper surface of the floating gate.

In yet another embodiment, an apparatus includes a common source region formed in a semiconductor substrate; at least a first drain region and a second drain region formed in the semiconductor substrate on opposite sides of and each spaced from the common source region; at least a first and a second floating gate formed over the semiconductor substrate adjacent to opposite sides of the common source region and disposed between the common source region and the first and second drain regions; a first control gate formed over a portion of the first floating gate, and a second control gate formed over a portion of the second floating gate, each of the first and second floating gates having a portion of the upper surface that is not covered by the respective first and second control gates; each of the first and second control gates having a drain side sidewall spacer, each drain side sidewall spacer formed of a composite spacer that extends vertically along the vertical side of the respective first and second control gates; each of the first and second control gates having a source side sidewall spacer, each of the source side sidewall spacers formed of the composite spacer that extends vertically along a vertical side of the respective one of the first and second control gates adjacent the common source region, wherein the drain side sidewall spacers have a first thickness and the source side sidewall spacers have a second thickness less than the first thickness; and an erase gate formed over the common source region in the semiconductor substrate overlying a portion of the upper surface each of the first and second floating gates.

In another embodiment, in the above apparatus, the erase gate is formed overlying at least a portion of the upper surface of the first and second floating gates covers between 5 and 20 percent of the upper surface of the respective first and second floating gate. In still another embodiment, in the above apparatus, the source side sidewall and the drain side sidewall of the first and second control gates are each formed of composite spacers comprising a nitride spacer adjacent the respective first and second control gate and of an oxide spacer overlying the nitride spacer. In yet another embodiment, in the above apparatus, the drain side sidewalls of the first and second control gates each have an L shape at the bottom portion, adjacent to and extending horizontally over the upper surface of the respective one of the first and second floating gates. In still another embodiment, the above apparatus includes wherein the source side sidewall of the first and second control gates ends at the upper surface of the respective one of the first and second floating gates and does not extend horizontally substantially over the upper surface of the floating gate.

Although the illustrative embodiments and advantages have been described in detail, it should be understood that various changes, substitutions, and alterations can be made herein without departing from the spirit and scope the embodiments and as defined by the appended claims. For example, alternate materials, implant doses, process steps and temperatures may be implemented.

Moreover, the scope of the present application is not intended to be limited to the particular embodiments of the process, machine, manufacture, composition of matter, means, methods, and steps described in the specification. As one of ordinary skill in the art will readily appreciate from the present disclosure, processes, machines, manufacture, compositions of matter, means, methods, or steps, presently existing or later to be developed, that perform substantially the same function or achieve substantially the same result as the corresponding embodiments described herein may be utilized. Accordingly, the appended claims are intended to include within their scope such processes, machines, manufacture, compositions of matter, means, methods, or steps.

What is claimed is:

1. An method comprising:
providing a substrate;
forming a floating gate layer over the substrate and a control gate over the floating gate layer, the floating gate layer having a first portion extending past a first side of the control gate and a second portion extending past a second side of the control gate;
forming a first dielectric layer over a first sidewall and a second sidewall of the control gate and over the floating gate layer on the first side and the second side of the control gate;
removing a first horizontal portion of the first dielectric layer extending over the first portion of the floating gate layer, a second horizontal portion of the first dielectric layer extending over the second portion of the floating gate layer remaining;
after the removing, forming a second dielectric layer over the first dielectric layer along the first sidewall and the second sidewall of the control gate, the second dielectric layer directly contacting an upper surface of the first portion of the floating gate layer, the first dielectric layer completely separating the second dielectric layer from the upper surface of the second portion of the floating gate layer; and
after the forming the second dielectric layer, patterning the floating gate layer on the first side and the second side of the control gate to form a floating gate.

2. The method of claim 1, wherein the first dielectric layer forms an L-shaped liner along the second side of the control gate.

3. The method of claim 1, further comprising forming an erase gate extending over at least a portion of the floating gate.

4. The method of claim 3, wherein the erase gate overlies at least 5 percent of the floating gate.

5. The method of claim 3, wherein the erase gate overlies between 5 and 20 percent of the floating gate.

6. The method of claim 3, wherein the erase gate overlies between 5 and 10 percent of the upper surface of the floating gate.

7. A method comprising:
forming a floating gate layer over a semiconductor substrate and a control gate layer over the floating gate layer;
patterning the control gate layer, thereby forming a control gate having a first sidewall on a first side and a second sidewall on a second side;
forming a first dielectric layer over the first sidewall and the second sidewall of the control gate;
patterning the first dielectric layer along the first sidewall such that the first dielectric layer is discontinuous with the first dielectric layer along the second sidewall;
after the patterning the first dielectric layer, forming a second dielectric layer over the first dielectric layer along the first sidewall and the second sidewall;
patterning the second dielectric layer along the first sidewall and the second sidewall, the second dielectric layer being in direct contact with the floating gate layer on the first side of the control gate, the first dielectric layer being interposed between the second dielectric layer and the floating gate layer on the second side of the control gate;
patterning the floating gate layer using the first dielectric layer and the second dielectric layer as a mask, thereby forming a floating gate having a first side and a second side, the first dielectric layer and the second dielectric layer being used as a mask to pattern both the first side and the second side of the floating gate;
removing the second dielectric layer along the first sidewall; and
forming an erase gate along the first sidewall, the erase gate overlying at least a portion of the floating gate.

8. The method of claim 7, further comprising masking the second dielectric layer along the second sidewall prior to the removing the second dielectric layer along the first sidewall, such that the second dielectric layer along the second sidewall remains.

9. The method of claim 7, after the patterning the floating gate, further comprising forming a third dielectric layer over the second dielectric layer.

10. The method of claim 9, patterning the third dielectric layer, thereby exposing the semiconductor substrate in a common source region on a first side of the floating gate.

11. The method of claim 7, wherein the forming the erase gate comprises forming a third dielectric layer over an exposed portion of the floating gate on the first side of the control gate, and forming the erase gate over the third dielectric layer.

12. The method of claim 7, wherein the erase gate overlies at least 5 percent of the floating gate.

13. The method of claim 7, wherein the erase gate overlies between 5 and 20 percent of the floating gate.

14. The method of claim 7, wherein the erase gate overlies between 5 and 10 percent of the floating gate.

15. An apparatus comprising:
a substrate;
a floating gate over the substrate;
a control gate over the floating gate, the floating gate having a first portion extending past a first side of the control gate and a second portion extending past a second side of the control gate;
a first dielectric layer extending over a first sidewall and a second sidewall of the control gate, the first dielectric layer completely covering an upper surface of the second portion of the floating gate, the first dielectric layer having an L-shape over the second portion of the floating gate, the first dielectric layer not having an L-shape over the first portion of the floating gate;
a second dielectric layer over the first dielectric layer, the second dielectric layer directly contacting an upper surface of the first portion of the floating gate; and
a third dielectric layer over the first dielectric layer over the second portion, the first dielectric layer completely separating the third dielectric layer from the upper surface of the second portion of the floating gate.

16. The apparatus of claim 15, further comprising an erase gate, the erase gate extending over the first portion of the floating gate.

17. The apparatus of claim 16, further comprising a common source in the substrate below the erase gate.

18. The apparatus of claim 16, wherein the erase gate overlying at least a portion of the upper surface of the floating gate covers at least 5 percent of the upper surface of the floating gate.

19. The apparatus of claim 16, wherein the erase gate overlying at least a portion of the upper surface of the floating gate covers between 5 and 20 percent of the upper surface of the floating gate.

20. The apparatus of claim 16, wherein the erase gate overlying at least a portion of the upper surface of the floating gate covers between 5 and 10 percent of the upper surface of the floating gate.

* * * * *